United States Patent
Schwabe et al.

(10) Patent No.: US 7,218,550 B2
(45) Date of Patent: May 15, 2007

(54) MAGNETIC STORAGE DEVICE

(76) Inventors: Nikolai Franz Gregor Schwabe, 70 Cardigan Street, Oxford OX2 6BP (GB); Carsten Heide, Weisenweg 14, 24242 Felde (DE); Roger James Elliott, 11 Crick Road, Oxford OX2 6Q1 (GB)

( * ) Notice: Subject to any disclaimer, the term of this patent is extended or adjusted under 35 U.S.C. 154(b) by 45 days.

(21) Appl. No.: 10/874,205

(22) Filed: Jun. 24, 2004

(65) Prior Publication Data

US 2004/0233761 A1 Nov. 25, 2004

Related U.S. Application Data

(63) Continuation of application No. 10/364,655, filed on Feb. 12, 2003, now abandoned, which is a continuation of application No. 09/830,412, filed as application No. PCT/EP99/08368 on Nov. 2, 1999, now abandoned.

(30) Foreign Application Priority Data

Oct. 30, 1998 (GB) ................................. 9823694.6

(51) Int. Cl.
*G11C 11/15* (2006.01)
(52) U.S. Cl. ...................... 365/173; 365/105; 365/158; 365/171
(58) Field of Classification Search ................ 365/173, 365/171, 158, 105
See application file for complete search history.

(56) References Cited

U.S. PATENT DOCUMENTS

| | | | |
|---|---|---|---|
| 4,731,757 A | 3/1988 | Daughton et al. | |
| 4,780,848 A | 10/1988 | Daughton et al. | |
| 5,173,873 A | 12/1992 | Wu et al. | |
| 5,541,868 A | 7/1996 | Prinz | |
| 5,640,343 A * | 6/1997 | Gallagher et al. | 365/171 |
| 5,650,958 A * | 7/1997 | Gallagher et al. | 365/173 |
| 5,734,605 A | 3/1998 | Zhu et al. | |

(Continued)

FOREIGN PATENT DOCUMENTS

EP 0780912 6/1997

(Continued)

*Primary Examiner*—Gene N. Auduong
(74) *Attorney, Agent, or Firm*—Miles & Stockbridge PC

(57) ABSTRACT

A magnetic storage device comprises an array of magnetic memory cells (50). Each cell (50) has, in electrical series connection, a magnetic tunnel junction (MTJ) (30) and a Zener diode (40). The MTJ (30) comprises, in sequence, a fixed ferromagnetic layer (FMF) (32), a non-magnetic spacer layer (33), a tunnel barrier layer (34), a further spacer layer (35), and a soft ferromagnetic layer (FMS) (36) that can change the orientation of its magnetic moment. The material type and thickness of each layer in the MTJ (30) is selected so that the cell (50) can be written by applying a voltage across the cell, which sets the orientation of the magnetic moments of the FMF (32) and FMS (36) relative to one another. The switching is effected by means of an induced exchange interaction between the FMS and FMF mediated by the tunneling of spin-polarised electrons in the MTJ (30). The cell (50) therefore has low power consumption during write operations allowing for fast writing and dense integration of cells (50) in an array. The mechanism used to control the array to write and sense the information stored in the cells (50) is simplified.

41 Claims, 5 Drawing Sheets

U.S. PATENT DOCUMENTS

| | | | |
|---|---|---|---|
| 5,764,567 A | * | 6/1998 | Parkin ................. 365/173 |
| 5,793,697 A | | 8/1998 | Scheuerlein |
| 5,801,984 A | * | 9/1998 | Parkin ................. 365/158 |
| 5,835,314 A | | 11/1998 | Moodera et al. |
| 5,841,692 A | * | 11/1998 | Gallagher et al. ...... 365/173 |
| 5,991,193 A | | 11/1999 | Gallagher et al. |
| 6,072,718 A | | 6/2000 | Abraham et al. |
| 6,114,719 A | | 9/2000 | Dill et al. |
| 6,130,835 A | | 10/2000 | Scheuerlein |
| 6,269,018 B1 | | 7/2001 | Monsma et al. |
| 6,316,965 B1 | * | 11/2001 | Jonker et al. ............ 326/134 |
| 6,331,944 B1 | | 12/2001 | Monsma et al. |

FOREIGN PATENT DOCUMENTS

| | | |
|---|---|---|
| GB | 1124340 | 8/1968 |
| GB | 1237904 | 7/1971 |
| GB | 932146 | 7/1983 |
| WO | WO 95/22820 | 2/1995 |
| WO | WO 97/39488 | 10/1997 |
| WO | WO 96/11469 | 9/2005 |

* cited by examiner

MAGNETIC STORAGE DEVICE

CROSS-REFERENCE TO RELATED APPLICATIONS

This application is a continuation of application Ser. No. 10/364,655 filed Feb. 12, 2003 now abandoned, which is a continuation of application Ser. No. 09/830,412 filed Apr. 27, 2001 now abandoned, which is a 371 of International Application No. PCT/EP99/08368 filed Nov. 2, 1999.

FIELD OF THE INVENTION

The present invention relates to non-volatile magnetic random access memory (MRAM) storage elements.

BACKGROUND OF THE INVENTION

Important characteristics of mass information storage devices of the future should be high speed, low power consumption, low cost and small size. To achieve this aim, magnetic random access memories (MRAMs) have been proposed due to their non-volatile nature. Unlike dynamic random access memory (DRAM) cells, non-volatile memory cells such as MRAM cells do not require a complex circuitry for perpetual electronic refreshing of the information stored, and thus can in principle outperform DRAM cells in all above mentioned characteristics.

The first of such MRAMs were based on magnetic multi-layer structures, deposited on a substrate. U.S. Pat No. 5,343,422, for example, discloses a structure in which two layers of ferromagnetic material are separated by a layer of non-magnetic metallic conducting material. One of the magnetic materials, called the ferromagnetic fixed layer (FMF), has a fixed direction of magnetic moment, e.g. by having a particularly high coercive field or strong uni-axial anisotropy. The magnetisation of the other magnetic layer, called the ferromagnetic soft layer (FMS), is free to change direction between parallel and anti-parallel alignment relative to the direction of the magnetic moment of FMF.

The state of the storage element represents a logical "1" or "0" depending on whether the directions of the magnetic moments of the magnetic layers are aligned parallel or anti-parallel, respectively. Because the resistance levels are different for different mutual orientations of the magnetic layers, the structure acts as a spin valve. It thus allows the sensing of the state of the storage element by measuring the differential resistance $\Delta R/R$ with a current, where $\Delta R$ is the difference in resistance of the storage element for two different states of orientation, and R is its total resistance. Due to the high conductance of the device, strong currents are needed to obtain a high enough output voltage signal level for the sensing operation. A switching between these orientations can be achieved by passing write currents in the vicinity of the FMS, usually by using write lines which run past the layered structure on either side. These write currents, which do not pass through the layered structure itself, induce a magnetic field at the location of the FMS which alters the orientation of the FMS, if it is stronger than the coercive field $H_C$ of the FMS.

The main disadvantage of this set-up is the relatively high power consumption during both write and sense operations due to the high conductance of the structure. For example, conducting thin films have low sheet resistivities of about $10\Omega/\mu m^2$ leading to cell resistances of about $10\Omega$ for currently realisable devices. Such devices require high sense currents of the order of a 0.1 mA in order to get voltage signals in the region of 1 mV. Therefore MRAM storage devices with higher resistance have been sought for.

An alternative was proposed by J. M. Doughton, *J.Appl. Phys.*, 81, pp. 3758–3763 (1997). There, the conducting non-magnetic spacer layer between the two magnetic layers is replaced by an insulator. The device therefore forms a magnetic tunnel junction (MTJ), where spin polarised electrons tunnel through the insulator. It has a high impedance with resistivity values of $10^4$–$10^9\Omega/\mu m^2$, allowing for high speed MRAMs. Further, when put into a two dimensional array such an MRAM cell can be controlled by just using two lines per cell, the minimum needed to locate the cell in such an array. Such an array, shown in FIG. 1A is proposed in U.S. Pat. No. 5,640,343, the disclosure of which is incorporated herein by reference.

With reference to FIG. 1A, the memory cell elements are arranged vertically between parallel electrically conductive word lines 1, 2, 3 and bit lines 4, 5, 6. This makes the device topologically simple and allows in principle for a denser array than is achievable with a similar line-width process for DRAMs. The MRAM array shown in FIG. 1A uses memory cells 9, shown in FIG. 1B, that comprise each a MTJ 8 and a p-n diode 7 in electrical series connection. The diode 7 is formed as a silicon junction with an n-type layer 10 and a p-type layer 11. It is connected by an intermediate layer 12 to the MTJ 8, which is formed as a series of stacked layers comprising a template layer 15, a first ferromagnetic layer 16, a anti-ferromagnetic layer 18 a FMF 20, a tunnelling barrier layer 22, a FMS 24 and contact layer 25.

The presence of the diode 7 in the memory cell 9 allows the use of only two lines per cell. The device can be operated such that during a sense operation only one memory cell in the MRAM will be forward biased whereas the remaining cells will either not be biased or reverse biased. Since the reverse bias is always kept below the breakdown voltage of the diode 7, no current flows through these cells.

A cell is written by sending simultaneously a current through the word and bit line crossing at the location of the cell. Although these currents do not pass through the cell itself, the magnetic field induced by the current at the location of the FMS is strong enough to switch the orientation of the magnetic moment between its two preferred states along the easy axis of the FMS. The FMF, however, has a coercivity that is high enough such that its magnetic moment is left unchanged in this process. Similarly, in the other memory cells which lie along either the bit or word line used in the switching, the magnetic field induced by the current passing only in one line is not strong enough to switch the FMS. This set-up however still suffers from high power consumption during write operations.

As a consequence of the magnetic fields of the switching currents the density of planar integration of MJT cells in an array is also limited. Further, the supporting electric circuitry has to be designed such that both write and sense currents can be effected to flow along different paths which makes such circuitry quite complex.

SUMMARY OF THE INVENTION

In its first aspect, the present invention comprises a magnetic tunnel junction device comprising first and second stacks of layers of magnetic material, each stack comprising at least one layer, the stacks being separated by a third stack of layers of non-magnetic material, the third stack comprising at least one layer of electrically insulating material, with contacts being made to the first and second stack to apply a voltage across the device, the magnetic materials and insulating material(s) each being of a type and the said layers each having a thickness such that the orientation of the magnetic moments of said first and second stack relative to one another are changeable by applying a voltage across the device, characterised in that said orientation can be switched to a first state by applying a first voltage across the device and that said orientation can be switched to a second state applying a second voltage across the device, whereby after either switching the said orientation is maintained when a third voltage is applied to the device the said third voltage being in between the first and second voltage.

Preferably, the magnetic tunnel junction device comprises a layer of non-magnetic conductive material between at least one of the layers of magnetic material in the first or second stack and the at least one layer of insulating material in the third stack.

Preferably, a single layer of insulating material is provided to form a single tunnel barrier between the first and second stack. Alternatively, two layers of insulating material separated by a layer of non-magnetic conductive material may be provided to form a double tunnel barrier, which can be advantageous due to its special transmission characteristics.

In its second aspect the present invention comprises an array of magnetic memory cell devices, said array comprising a first plurality of conducting leads, a second plurality of conducting leads, each lead in the said second plurality crossing over each lead in the said first plurality, a plurality of magnetic memory cell devices, each magnetic memory cell device comprising in electrical series connection a diode and a magnetic tunnel junction device according to the first aspect of the present invention, each magnetic memory cell device being located at an intersection region between one of the first plurality of leads and one of the second plurality of leads, the array having means to apply a voltage to the leads in the first and second plurality such that a voltage drop across a specific memory cell device can be effected the voltage drop causing the said memory cell device to be written.

In its third aspect the present invention comprises a method of providing a magnetic tunnel junction device comprising providing a magnetic tunnel junction comprising first and second stacks of layers of magnetic material, each stack comprising at least one layer, the stacks being separated by a third stack of layers of non-magnetic material, the third stack comprising at least one layer of electrically insulating material, with contacts being made to said first and second stack to apply a voltage across the magnetic tunnel junction the type and thickness of said magnetic and insulating materials being selected such that the orientation of the magnetic moments of said first and second stack relative to one another can be changed by applying a voltage across the device, characterised in that said orientation can be switched to a first state by applying a first voltage across the device and that said orientation can be switched to a second state applying a second voltage across the device, whereby after either switching the said orientation is maintained when a third voltage is applied to the device the said third voltage being in between the first and second voltage.

In its fourth aspect the present invention comprises a method of providing an array of magnetic memory cell devices comprising providing a first plurality of conducting leads, a second plurality of conducting leads, each lead in the said second plurality crossing over each lead in the said first plurality, a plurality of magnetic memory cell devices, each magnetic memory cell device comprising in electrical series connection a diode and a magnetic tunnel junction device according to the third aspect of the present invention, each magnetic memory cell device being located at an intersection region between one of the first plurality of leads and one of the second plurality of leads, and providing means to apply a voltage to the leads in the first and second plurality such that a voltage drop across a specific memory cell device can be effected, the voltage drop causing a magnetic field in the device through tunnelling of spin-polarised electrons which effects the device to be written by setting the orientation of the said magnetic moments relative to one another.

In this second and fourth aspect the present invention is therefore an MRAM using MTJ elements as memory cells in implementations where both write and sense currents are passing through the cell perpendicularly. The invention utilises the combined effect of the nonlinear current-voltage characteristics of the tunnel process and the non-equilibrium exchange coupling between the two magnetic layers (N. F. Schwabe et al., *Physical Review B* 54, pp. 12953–12968 (1996) and R. J. Elliott et al., *Journal of Magnetism and Magnetic Materials* 177–181, pp. 769–770 (1998)).

It has been shown that when a MTJ, and preferably a MTJ comprising a non-magnetic spacer layer (NMS) between the FMS and the barrier layer and between the FMF and the barrier layer, is significantly biased out of equilibrium a strong spin polarised tunnelling current flows through the MTJ. At the same time, due to the difference in Fermi-wavevectors on either side of the MTJ, the exchange interaction changes its characteristic periodicity, and becomes a superposition of periodic functions with several wavelengths. Further, when the MTJ is biased, a strong spin-current induced exchange interaction (SCE) occurs between the magnetic layers on either side of the MTJ, which has terms that scale with the voltage and the thickness of the FMF and the FMS. This allows changing both the sign and the strength of the exchange interaction by applying voltage across the device that is higher than a typical voltage used to sense the device.

Switching occurs when the voltage across the device is strong enough to induce a spin current across the junction which carries a magnetic field $H_E$ across the junction that is higher than the coercive field $H_C$ of the FMS and that has opposite sign of the alignment of the magnetic moment of the FMS. When the voltage across the MTJ is lowered again after such switching has been effected the spin-current induced magnetic field $H_E$ sinks below the coercive field $H_C$ of the FMS, and the FMS remains in the switched state.

In order to switch the device in the opposite direction, the MTJ has to be designed such that, when the junction is biased reverse the first time the SCE exceeds $H_C$ of the FMS, the sign of the interaction is opposite that of the SCE when used to switch the FMS using a forward voltage. For this purpose, the MTJ has to be designed to have an asymmetric voltage-interaction response. For example the thickness of the FMS and the FMH have to be controlled such that the voltage-interaction response curve scales in relation to $H_C$ approximately as shown in FIG. 3, where for forward voltage the first switching always occurs towards parallel alignment between the FMS and the FMF and for reverse voltage to anti-parallel alignment. FIG. 3 will be described in more detail later.

To sense the orientation of the FMS and FMF relative to one another, a weak sense voltage, that does not affect the orientation of the FMS, is applied across the device, and the resistance differential of the MTJ $\Delta R/R$ is measured with respect to a given reference orientation similar to that in devices of the prior art.

Being able to switch the FMS by applying a voltage across the memory cell according to the present invention, rather than running strong currents past the memory cell which do not flow across the cell, substantially reduces the power consumption of the device and impedance effects in the MRAM array. Further, only having to control voltages across a memory cell according to the invention, compared with having to control both voltages across cells and currents flowing past cells, reduces the complexity of the electrical circuit driving the MRAM array.

SPECIFIC EMBODIMENTS

Further embodiments of the present invention shall now be described with reference to the accompanying drawings in which.

Figure 2:
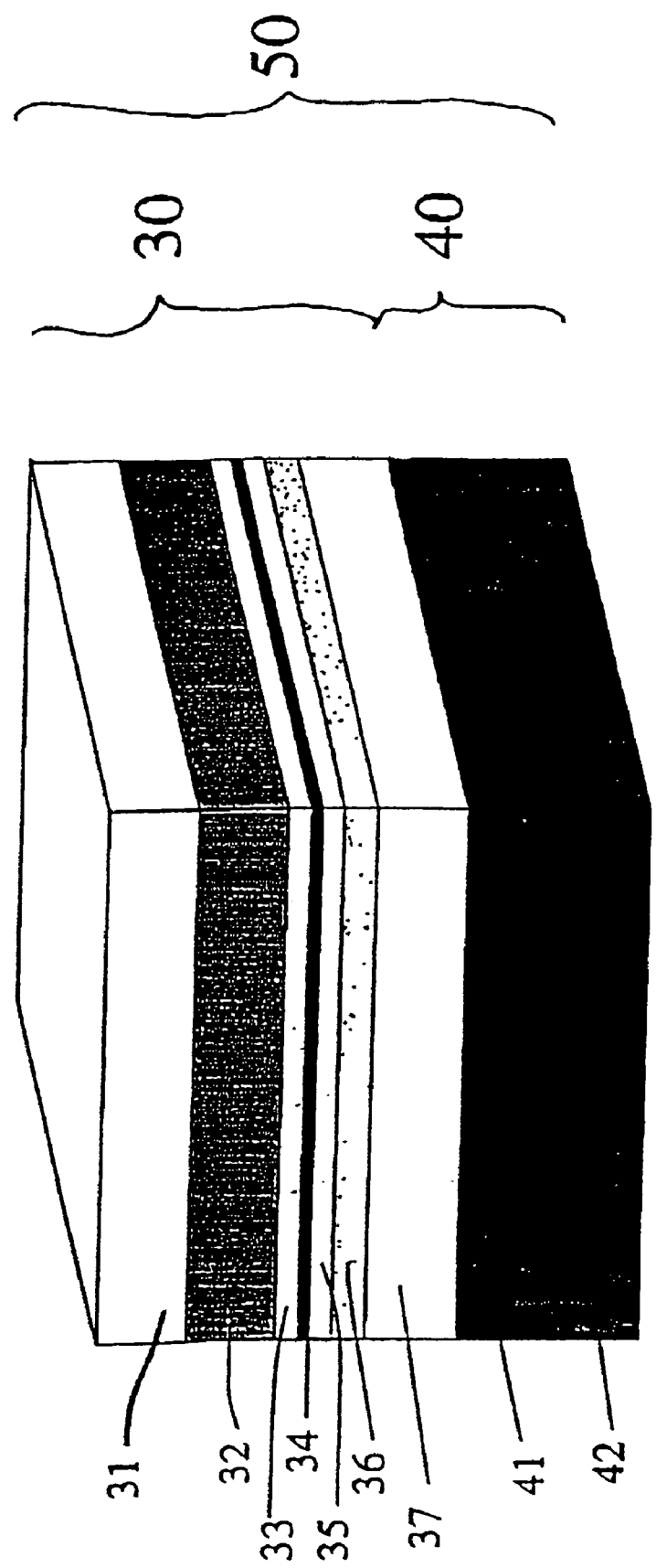
Figure 3:
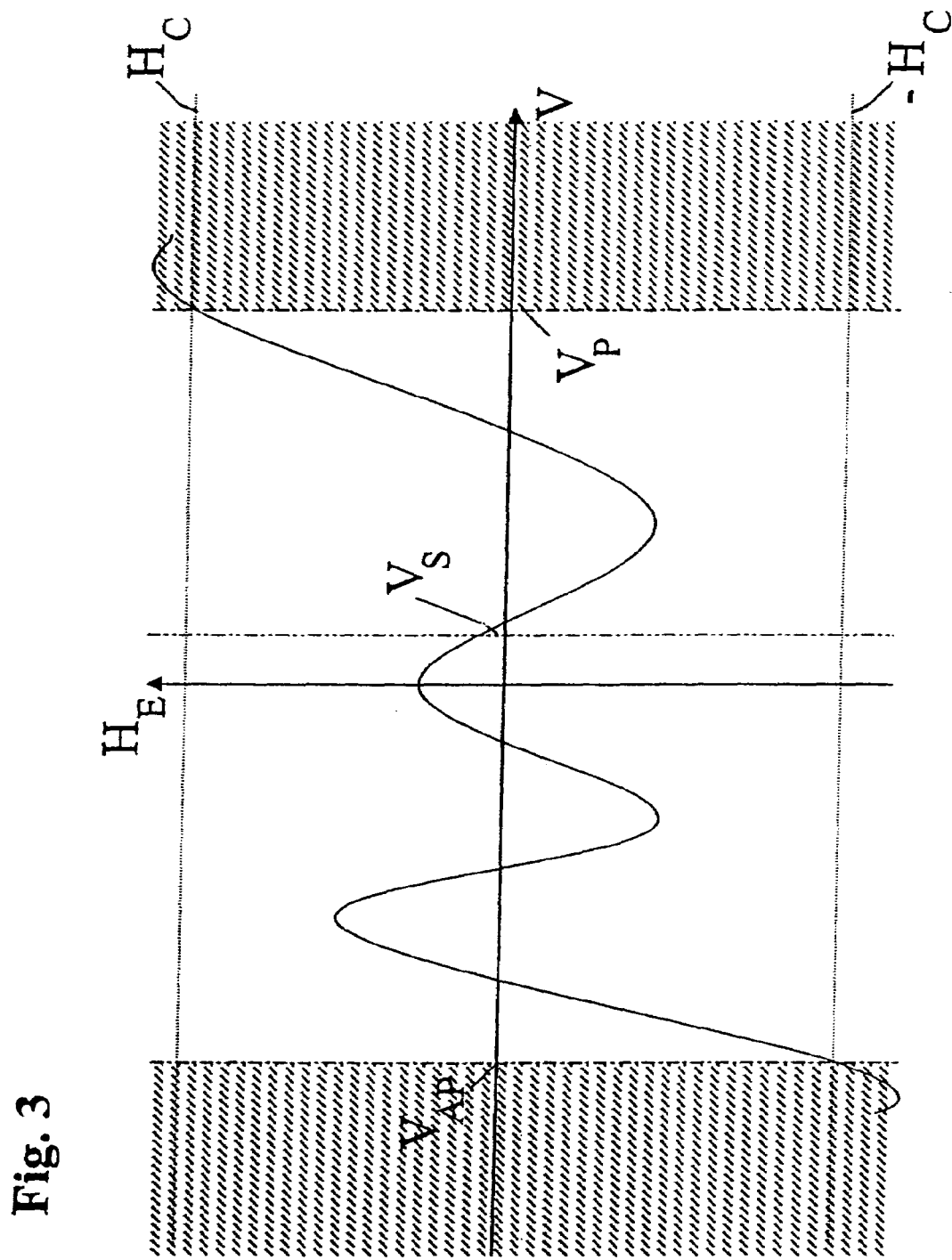
Figure 4:
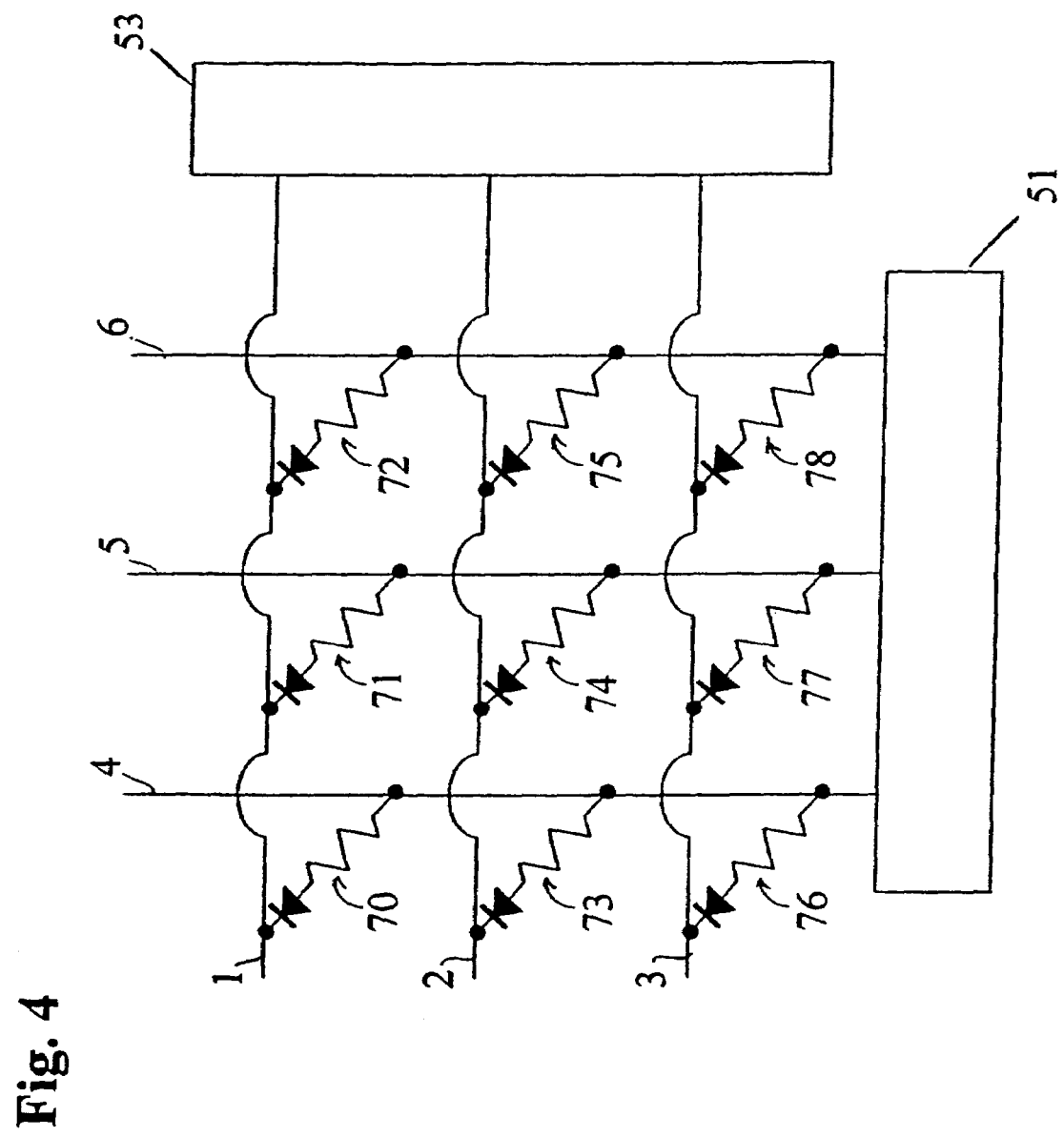
Figure 5:
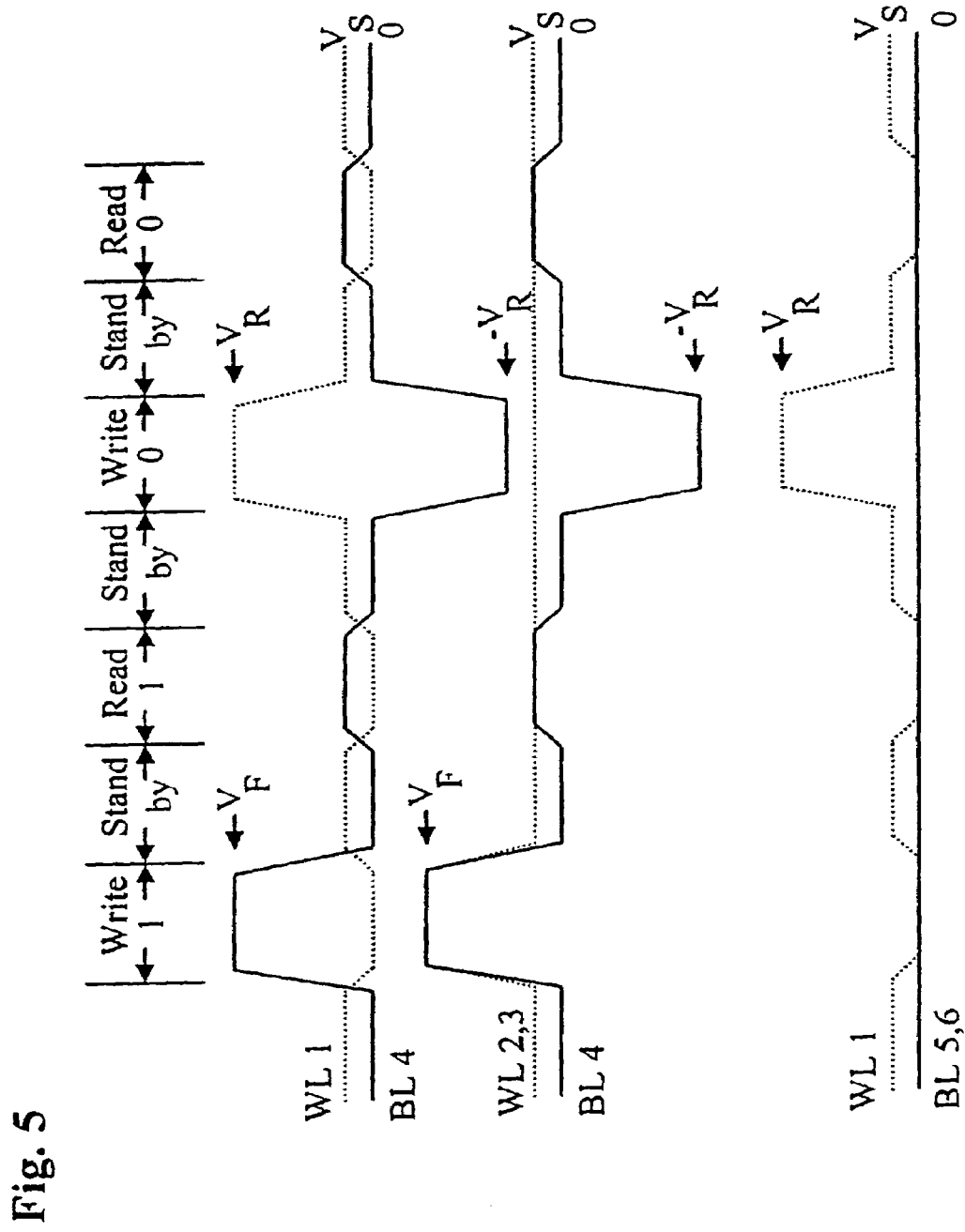

FIG. 2 shows a perspective view of a memory cell according to the present invention, FIG. 3 shows the exchange field—voltage response of an MTJ memory cell in relation to the coercive field $H_C$ of the FMS according to the invention, FIG. 4 shows schematically the diagram of the electric circuit formed by the MRAM array, and FIG. 5 illustrates the voltage levels on the leads in the MRAM array according to the invention.

Figure 1:
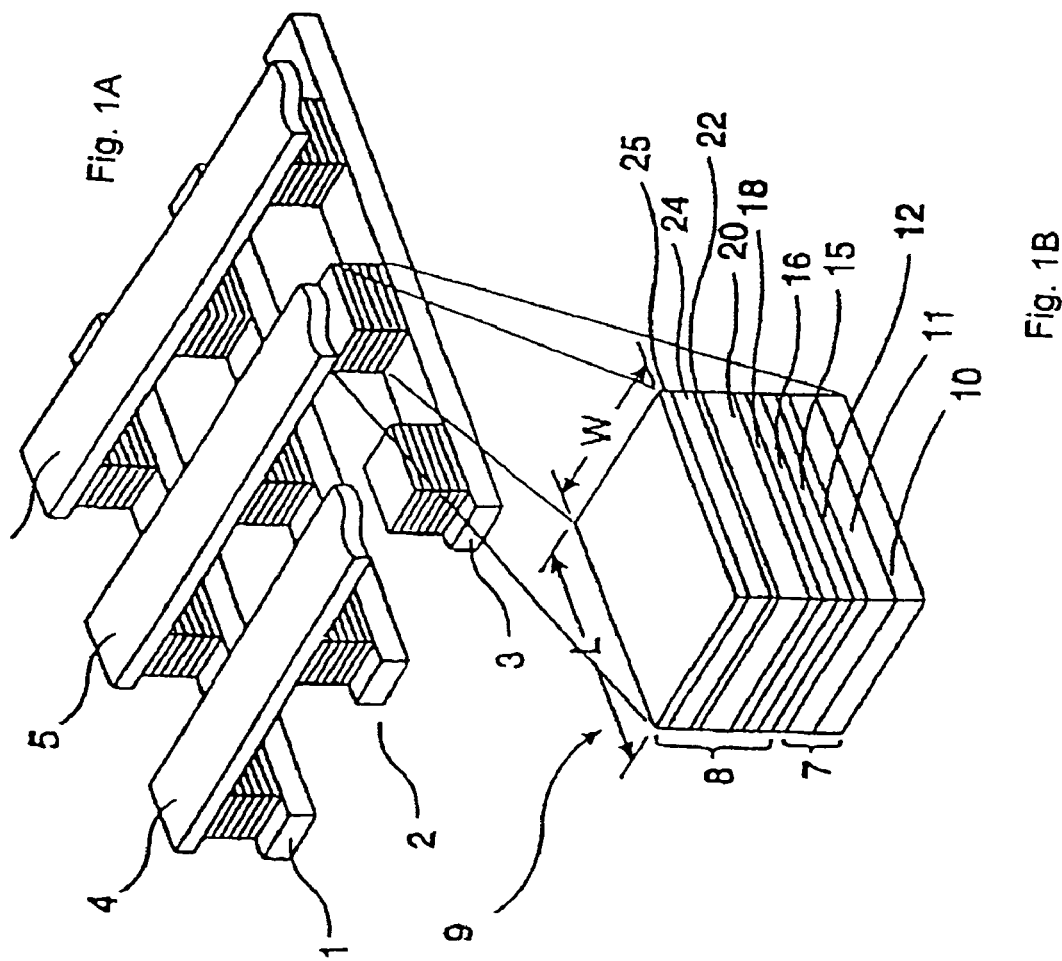
FIG. 1A shows a perspective view of a MRAM array with magnetic memory cells located vertically between bit and word lines.
FIG. 1B shows an enlarged view of one of the memory cells shown in FIG. 1A.

FIG. 1A and FIG. 1B have already been described.

CONSTRUCTION AND OPERATION OF THE MEMORY CELL

The memory cell 50 in FIG. 2. is formed as a series of layers similar to the one disclosed in U.S. Pat. No. 5,640,343, but different in detail. In one of its preferred embodiments the cell comprises an MTJ 30 in series with a PN junction diode 40. The MTJ comprises a first contact layer 31, which can be Cu or Pt, a FMF 32 such as Co—Pt—Cr, a first NMS 33 such as Cu or Pt, a tunnelling barrier layer 34 such as MgO, a second NMS 35 such as Cu or Pt, a FMS 36 such as Ni—Fe, and a second contact layer 37 such as Cu or Pt.

The diode 40 is formed on a semiconductor substrate such as Si and contains layers of p- and n-doped Si 41 and 42, respectively. The p-doped region 41 is in contact with the second contact layer 39 and the n-doped region 42 is in contact with a word line (not shown). The initial contact layer 31 is in contact with the bit line (not shown). Preferably, the diode is formed as a Zener-diode, i.e. it can be operated through a reverse breakdown voltage in the avalanche breakdown region.

The FMF 32 and the FMS 36 are fabricated to have easy axes of magnetisation that align with one another. By using for the FMF 32 a material with particularly high anisotropy such as Co—Pt—Cr the direction of magnetisation of the easy axis of the FMF 32 is fixed against the one of the FMS 36. Alternatively, the direction of magnetisation of the FMF 32 can be set by an unidirectional anisotropy as given, for example, in U.S. Pat. No. 5,465,185. For the FMS 36 there are two possible directions along its easy axis, which define the two states of the memory cell. In addition the FMS may be fabricated to have a low coercivity by giving it an elliptical shape or forming tapers at the corners, giving it a hexagonal or octagonal shape, in order to suppress the effects of edge domains.

There are several differences between this embodiment and the prior art. The properties of the FMF 32 and the FMS 36 are not chosen with regard to their response to writing fields produced by external writing currents, but with regard to an optimal current-voltage characteristics facilitating both read and write operations by passing a current perpendicularly through the cell 40. The thickness and magnetic properties of the FMF 32 and the FMS 36 are chosen to achieve an asymmetric SCE which has a voltage response function such as the one shown in FIG. 3.

The construction of the tunnel barrier 34 is not only determined by the desired values for $\Delta R/R$ to sense the state of the FMS 36, but also to accommodate switching. Due to its effect on the write performance of the device MgO is preferred as a material for the tunnel barrier 36. Alternatively, two layers of insulating material separated by a layer of non-magnetic conductive material may be provided to form a double tunnel barrier.

The presence of the NMSs 33 and 35 on one or both sides of the tunnel barrier between the FMF 32 and the tunnel barrier 34 as well as the FMS 36 and the tunnel barrier 34 is advantageous for the SCE effect as it allows the phase of the exchange interaction across the MTJ to be tuned. This is desirable to ensure that the sign of the SCE can be changed at a reasonable voltage level across the MTJ 30. The disadvantage of a very large spacer layer is, however, that the SCE decays over distance. Therefore, the right trade-off has to be achieved between appropriate phase and sufficient interaction amplitude in the optimal design of the thickness of both NMSs 33, 35.

Further advantages of the NMSs 33, 35 is that they help to reduce lattice mismatch, thus enlarging the range of possible magnetic materials, and also reduce the number of magnetic impurities in the tunnel barrier 34 which could impair the properties of the MTJ.

Further, the diode 40, formed as a Zener device, accommodates two operational regimes. One regime for the sense operation similar to the prior art, and the other one during write operations where for writing at least one of the two possible logical states a reverse voltage has to be applied to the diode 40 that is greater than its breakdown voltage.

It should be noted that although the presence of the NMSs facilitates the achievement of the desired characteristics of the MTJ their use is not strictly necessary and devices are conceivable without their use, but including the same form of operation.

FIG. 3 shows the strength of the exchange interaction, represented by the exchange field $H_E$ versus the voltage drop V across the MTJ 30. When the voltage across the MTJ is increased from the vicinity of zero beyond the forward bias $V_P$, such that $H_E > H_C$, and lowered back again to the inception point the FMS 36 will be left in parallel alignment with the FMF 32. Similarly, when V is increased beyond $V_{AP}$, such that $H_E < -H_C$, and subsequently lowered again to close to zero, the FMS 36 and FMF 32 will be left in anti-parallel alignment A sensing of the cell can be achieved by applying a small sensing voltage $V_S$ across the MTJ and measuring the resistance differential $\Delta R/R$ with respect to a given reference value. $V_S$ is thereby substantially smaller in absolute magnitude than both $V_P$ and $V_{AP}$.

It should be noted that the invention is not limited to the use of single layer FMF 32 and FMS 36, which can be replaced by stacks of magnetic layers, respectively, in order to tune the magnetic moment, anisotropy, and coercivity of these layers. Similarly the transmission characteristics of the tunnel barrier 34 can be tuned by replacing it with a double barrier structure that contains a conductive layer between two insulating layers.

Operation of the MRAM Array

An MRAM array according to the present invention has the same topographic design as the prior art MRAM array of FIG. 1A with the difference that it contains a memory cell according to the invention at each node in the array. A circuit diagram of the MRAM array according to the present invention is shown in FIG. 4, which is also similar to the prior art. As shown FIG. 4 the memory cells 70 to 78 lie at the intersections of the word lines 1, 2, 3 with the bit lines 4, 5, 6, which in turn are connected to the control circuits 51 and 53. Different from the operation of the prior art MRAM, however, a memory cell 70 is written by applying a strong voltage to the cell either as a forward or reverse voltage, depending on which way the cell should be switched. A voltage level diagram of the MRAM array of FIG. 4 in operation is shown in FIG. 5.

In FIG. 5 the cell 70 is first switched to a parallel alignment representing a logical "1", then the state of cell 70 is sensed. Subsequently, the cell is switched to an anti-parallel alignment representing a logical "0" after which the state of the cell is sensed again.

During the switching to state "1" a voltage $V_F$ is applied to bit line 4, using circuit 51. At the same time the voltage on bit lines 5 and 6 as well as word line 1 are set to zero, while the word lines 2 and 3 are also biased to the voltage $V_F$ using both circuits 51 and 53. The voltage $V_F$ across memory cell 70 induces a voltage drop $V_P$ across the MTJ which, as shown in FIG. 3, is strong enough to switch the orientation of its FMS in the MTJ to a parallel alignment. While the cell 70 is now biased forward at $V_F$, cells 71, 72, 73, and 76 are unbiased and cells 74, 75, 77, 78 are reverse biased at $-V_F$, which is still less than the breakdown voltage of the Zener-diode and therefore does not lead to a substantial voltage drop across the MTJ.

A sensing operation is carried out by applying a voltage $V_S$ to bit line 4, while setting the voltage on word line 1 to zero. At the same time bit lines 5,6 are kept at zero voltage whereas word lines 2,3 are biased to $V_S$. This way it can be seen that there will be a positive voltage drop $V_S$ across cell 70, whereas all the other cells either have no voltage drop across them or a small reverse voltage $-V_S$ which is smaller than the breakdown voltage of the Zener-diode.

Finally, an operation to write a logical "0" into cell 70 is achieved by setting the voltage on bit line 4 to $-V_R$ while setting the voltage on word line 1 to $V_R$. The total voltage drop across cell 70 of $-2V_R$ is now such that it is greater than the reverse breakdown voltage of the Zener-diode and such that it induces a voltage drop $V_{AP}$ across the MTJ which is strong enough to switch the FMS to "0", as indicated in FIG. 3. At the same time the voltage on bit lines 5,6 are left at zero, while the voltage on word lines 2,3 are kept at $V_S$. Neither of the voltage drops of $-V_R$ and $-V_R+V_S$ across cells 71, 72 and 73, 76, respectively are high enough to cause a reverse breakdown of the Zener-diode, thus avoiding a notable voltage drop across the relevant MTJs.

In the embodiment of the MRAM array described above, voltages are applied using the control circuits 51,53, such that during either a read or write operation only one cell will be addressed at any one time and the power consumption of the device is kept to a minimum. The method of applying voltages described here is merely an example to which the invention is not limited, and other combinations of applying voltages for operating a memory cell and the MRAM array are conceivable

The invention claimed is:

1. A magnetic tunnel junction device (30) comprising first and second stacks of layers of magnetic material (32, 36), each stack comprising at least one layer, the stacks (32, 36) being separated by a third stack of layers of non-magnetic material, the third stack (34) comprising at least one layer of electrically insulating material (34), with contacts (31, 36) being made to the first and second stack (32, 36) to apply a voltage across the device, the magnetic materials and insulating material each being of a type and the said layers each having a thickness such that the orientation of the magnetic moments of said first and second stack (32, 36) relative to one another are changeable by applying a voltage across the device, wherein said orientation can be switched to a first state by applying a first voltage across the device and said orientation can be switched to a second state applying a second voltage across the device, whereby after either switching the said orientation is maintained when a third voltage is applied to the device, the said third voltage being in between the first and second voltages.

2. The device of claim 1, wherein at least one of the said first and second stacks (32, 36) is separated from the third stack (34) by a further layer of non-magnetic conducting material (33,35).

3. The device of claim 1, wherein the third stack (34) comprises two layers of insulating material separated from one another by a layer of non-magnetic conductive material.

4. The device of claim 1, wherein at least one of the magnetic material in the said first or second stack (32, 36) has a substantially elliptical shape.

5. The device of claim 1, wherein at least one of the layers of magnetic material in the said first or second stack (32, 36) has a substantially hexagonal or octagonal shape.

6. The device of claim 1, wherein easy axes of the magnetization of the said first and second stacks (32, 36) are aligned with one another such that the orientation of the magnetic moments of said first and second stacks (32, 36) relative to one another are changeable between substantially parallel and substantially anti-parallel states.

7. The device of claim 6, the magnetic materials and the insulating material each being of a type and the said layers each having a thickness causing an asymmetric current response such that the changing from the substantially parallel state to the substantially anti- parallel state is allowed to be effected by applying a forward or backward voltage to the device, and wherein the change effected by applying the forward voltage is opposite to the change effected by applying the backward voltage.

8. The device of claim 1, further comprising sensing means connected to the said contacts which allows the orientation of the magnetic moments of said first and second stacks relative to one another to be sensed by applying a fourth voltage across the device and measuring the resistance of the device.

9. The device of claim 8, wherein the fourth voltage applied to the device in order to sense the state of the device is smaller in absolute terms than a voltage applied to the device in order to change the state of the device.

10. The device of claim 1, wherein the said third stack comprises at least one layer of manganese oxide (MgO).

11. The device of claim 10, wherein easy axes of the magnetization of the said first and second stacks (32), (36) are aligned with one another such that the device can be switched between two states in which the orientation of the magnetic moments of said first and second stacks (32), (36) can be changed from a substantially parallel alignment to substantially anti-parallel alignment by applying one of the said first and second voltages to the device and said magnetic moments can be switched from a substantially antiparallel alignment to a substantially parallel alignment by applying the other of the said first and second voltages to the device.

12. A magnetic tunnel junction device as claimed in claim 1, further comprising a selection device arranged in series therewith.

13. A magnetic tunnel junction device as claimed in claim 12, wherein the selection device comprises a non-linear selection device.

14. A magnetic tunnel junction device as claimed in claim 13, wherein the non-linear selection device comprises a diode.

15. A magnetic tunnel junction device as claimed in claim 14, wherein the diode comprises a Zener diode.

16. A magnetic memory cell device (50), comprising:
a magnetic tunnel junction device (30) that comprises first and second stacks of layers of magnetic material (32, 36), each stack comprising at least one layer, the stacks (32, 36) being separated by a third stack of layers of non- magnetic material, the third stack (34) comprising at least one layer of electrically insulating material (34), with contacts (31, 36) being made to the first and second stacks (32, 36) to apply a voltage across the device, the magnetic materials and insulating material each being of a type and the said layers each having a thickness such that the orientation of the magnetic moments of said first and second stacks (32,36) relative to one another are changeable by applying a voltage across the device, wherein said orientation can be switched to a first state by applying a first voltage across the device and said orientation can be switched to a second state by applying a second voltage across the device, whereby after either switching the said orientation is maintained when a third voltage is applied to the device, the said third voltage being in between the first and second voltages; and
a diode (40) in electrical series connection with the magnetic tunnel junction device.

17. The magnetic memory cell device of claim 16, wherein the diode (40) is a Zener diode.

18. The device of claim 16, comprising means for allowing to effect one of the said voltages required to switch the relative orientation of the magnetic moments of the said first and second stacks (32, 36) in the magnetic tunnel junction device (30) by allowing to apply a further voltage across the magnetic memory cell device (50), said further voltage effecting a voltage across the diode (40) which is a reverse voltage on the diode, said reverse voltage being greater than the breakdown voltage of the diode.

19. An array of magnetic memory cell devices as claimed in claim 16 comprising a first plurality of conducting leads (1-3), a second plurality of conducting leads (4-6), each lead in the said second plurality (4-6) crossing over each lead in the said first plurality (1-3), a plurality of magnetic memory cell devices (10-78), each magnetic memory cell device being located at an intersection region between one of the first plurality of leads (1-3) and one of the second plurality of leads (4-6), the array having means for applying a voltage to the leads (51,53) in the first and second plurality (1-3), (4-6) such that a voltage drop across a specific memory cell device can be effected, the voltage drop causing the said specific memory cell device to be written by setting the orientation of said magnetic moments relative to one another.

20. A method of providing a magnetic tunnel junction device (30) comprising providing a magnetic tunnel junction comprising first and second stacks of layers of magnetic material (32, 36), each stack comprising at least one layer, the stacks being separated by a third stack of layers of non-magnetic material (36), the third stack comprising at least one layer of electrically insulating material (34), with contacts (31, 37) being made to said first and second stack (32, 36) to apply a voltage across the magnetic tunnel junction, the type and thickness of said magnetic and insulating materials being selected such that the orientation of the magnetic moments of said first and second stacks (32, 36) relative to one another can be changed by applying a voltage across the device, wherein said orientation can be switched to a first state by applying a first voltage across the device and said orientation can be switched to a second state applying a second voltage across the device, whereby after either switching the said orientation is maintained when a third voltage is applied to the device, the said third voltage being in between the first and second voltages.

21. The method of claim 20, further comprising providing two layers of insulating material in the said third stack (34), which two layers of insulating material are separated from one another by a layer of non-magnetic conductive material.

22. The method of claim 20, wherein at least one of the layers of magnetic material in the said first or second stack is provided having a substantially elliptical shape.

23. The method of claim 20, wherein at least one of the layers of magnetic material in the said first or second stack (32, 36) is provided having a substantially hexagonal or octagonal shape.

24. The method of claim 20, further comprising providing a layer of non-magnetic conductive material (33, 35) between the said third stack (34) and at least one of the said first and second stacks (32, 36).

25. The method of claim 20, wherein the orientation of the magnetic moments of said first and second stacks (32, 36) relative to one another can be changed between substantially parallel and substantially anti- parallel states.

26. The method of claim 25, wherein changing from the substantially parallel state to the substantially anti-parallel state is effected by applying a forward or backward voltage to the device, wherein the change effected by applying the forward voltage is opposite the change effected by applying the backward voltage.

27. The method of claim 20, wherein the orientation of the magnetic moments of said first and second stacks (32, 36) relative to one another can be sensed by applying a fourth voltage across the magnetic tunnel junction device (30) and measuring the resistance of the device.

28. The method of claim 27, wherein the fourth voltage applied to the device in order to sense the orientation of the magnetic moments of the said first and second stacks (32, 36) relative to one another is smaller in absolute terms than the voltage applied to the device in order to change the relative alignment of said magnetic moments.

29. The method of claim 20, wherein the said third stack (34) is provided with at least one layer of manganese oxide (MgO).

30. The method of claim 29, wherein the device can be switched between two states in which the orientation of the magnetic moments of said first and second stacks (32,36) can be changed from a substantially parallel alignment to substantially anti-parallel alignment by applying one of the said first and second voltages to the device and said magnetic moments can be switched from the substantially anti-parallel alignment to the substantially parallel alignment by applying the other of the said first and second voltages to the device.

31. The method of claim 20, further comprising providing a diode (40) in electrical series connection with the magnetic tunnel junction device (30) to form a magnetic memory cell device (50).

32. The method of claim 31, wherein the diode (40) is a Zener diode.

33. The method of claim 31, wherein one of the said voltages required to switch the relative orientation of the magnetic moments of said first and second stacks (32, 36) in the magnetic tunnel junction device (30) is effected by applying a further voltage across the magnetic memory cell (50) device, said further voltage effecting a voltage across the diode which is a reverse voltage on the diode (40), said reverse voltage being greater than the breakdown voltage of the diode (40).

34. A method of providing an array of magnetic memory cell devices, comprising:
providing a first plurality of conducting leads (1-3), a second plurality of conducting leads (4-6), each lead in the said second plurality (4-6) crossing over each lead in the said first plurality (1-3); and
providing a plurality of magnetic memory cell devices (70-78) each having a magnetic tunnel junction comprising first and second stacks of layers of magnetic material (32, 36), each stack comprising at least one layer, the stacks being separated by a third stack of layers of non-magnetic material (36), the third stack comprising at least one layer of electrically insulating material (34), with contacts (31, 37) being made to said first and second stacks (32, 36) to apply a voltage across the magnetic tunnel junction, the type and thickness of said magnetic and insulating materials being selected such that the orientation of the magnetic moments of said first and second stacks (32, 36) relative to one another can be changed by applying a voltage across the device, wherein said orientation can be switched to a first state by applying a first voltage across the device and said orientation can be switched to a second state applying a second voltage across the device, whereby after either switching the said orientation is maintained when a third voltage is applied to the device, the said third voltage being in between the first and second voltages, and a diode (40) in electrical series connection with a corresponding magnetic tunnel junction, said each magnetic memory cell device being located at an intersection region between one of the first plurality of leads (1-3) and one of the second plurality of leads (4-6), and providing means for applying a voltage to the leads (51, 53) in the first and second plurality (1-3), (4-6) such that a voltage drop across a specific memory cell device can be effected, the voltage drop causing a magnetic field in the device through tunnelling of spin-polarised electrons which effects the device to be written by setting the orientation of the said magnetic moments relative to one another.

35. A magnetic memory cell device (50), comprising:
a magnetic tunnel junction device (30) that comprises first and second stacks of layers of magnetic material (32, 36), each stack comprising at least one layer, the stacks (32, 36) being separated by a third stack of layers of non- magnetic material, the third stack (34) comprising at least one layer of electrically insulating material (34), with contacts (31, 36) being made to the first and second stacks (32, 36) to apply a voltage across the device, the magnetic materials and insulating material each being of a type and the said layers each having a thickness such that the orientation of the magnetic moments of said first and second stacks (32, 36) relative to one another are changeable by applying a voltage across the device, wherein said orientation can be switched to a first state by applying a first voltage across the device and said orientation can be switched to a second state applying a second voltage across the device, whereby after either switching the said orientation is maintained when a third voltage is applied to the device, the said third voltage being in between the first and second voltages; and
a selection device in electrical series connection with the magnetic tunnel junction device.

36. A magnetic memory cell device as claimed in claim 35, wherein the selection device comprises a non-linear selection device.

37. The magnetic memory cell device of claim 36, wherein the non-linear selection device is a diode.

38. The magnetic memory cell device of claim 37, wherein the diode in a Zener diode.

39. An array of magnetic memory cell devices as claimed in claim 36 comprising a first plurality of conduction leads (1-3), a second plurality of conducting leads (4-6), each lead in the said second plurality (4-6) crossing over each lead in the said first plurality (1-3), a plurality of magnetic memory cell devices (70-78), each magnetic memory cell device being located at an intersection region between one of the first plurality of leads (1-3) and one of the second plurality of leads (4-6), the array having means for applying a voltage to the leads (51,53) in the first and second plurality (1-3), (4-6) such that a voltage drop across a specific memory cell device can be effected, the voltage drop causing the said specific memory cell device to be written by setting the orientation of said magnetic moments relative to one another.

40. The magnetic memory cell device of claim 35, comprising means for allowing to effect one of the said voltages required to switch the relative orientation of the magnetic moments of the said first and second stacks (32, 36) in the magnetic tunnel junction device (30) by allowing to apply a further voltage across the magnetic memory cell device (50), said further voltage effecting a voltage across the selection device which is a reverse voltage on the selection device, said reverse voltage being sufficiently large for the selection device to conduct.

41. An array of magnetic memory cell devices as claimed in claim 35, comprising a first plurality of conduction leads (1-3), a second plurality of conducting leads (4-6), each lead in the said second plurality (4-6) crossing over each lead in the said first plurality (1-3), a plurality of magnetic memory cell devices (70-78), each magnetic memory cell device being located at an intersection region between one of the first plurality of leads (1-3) and one of the second plurality of leads (4-6), the array having means for applying a voltage to the leads (51,53) in the first and second plurality (1-3), (4-6) such that a voltage drop across a specific memory cell device can be effected, the voltage drop causing the said specific memory cell device to be written by setting the orientation of said magnetic moments relative to one another.

* * * * *